United States Patent
Yang

(10) Patent No.: US 10,795,835 B2
(45) Date of Patent: *Oct. 6, 2020

(54) STORAGE DEVICE AND INTERFACE CHIP THEREOF

(71) Applicant: Silicon Motion Inc., Hsinchu County (TW)

(72) Inventor: Tsung-Chieh Yang, Hsinchu (TW)

(73) Assignee: Silicon Motion, Inc., Hsinchu County (TW)

(*) Notice: Subject to any disclaimer, the term of this patent is extended or adjusted under 35 U.S.C. 154(b) by 114 days.

This patent is subject to a terminal disclaimer.

(21) Appl. No.: 16/053,764

(22) Filed: Aug. 2, 2018

(65) Prior Publication Data

US 2019/0121756 A1    Apr. 25, 2019

Related U.S. Application Data

(63) Continuation of application No. 16/048,348, filed on Jul. 30, 2018.

(30) Foreign Application Priority Data

Oct. 20, 2017 (TW) .............................. 106136034 A

(51) Int. Cl.
*G06F 13/16* (2006.01)
*G06F 11/10* (2006.01)
*G11C 29/52* (2006.01)

(52) U.S. Cl.
CPC ...... *G06F 13/1668* (2013.01); *G06F 11/1004* (2013.01); *G06F 11/108* (2013.01);
(Continued)

(58) Field of Classification Search
CPC ............... G06F 13/1668; G06F 11/108; G06F 11/1012; G06F 11/1068; G06F 11/1004; G06F 13/1673; G11C 29/52
See application file for complete search history.

(56) References Cited

U.S. PATENT DOCUMENTS 7,257,683 B2   8/2007  Jeddeloh
7,466,577 B2   12/2008 Sekiguchi
(Continued)

FOREIGN PATENT DOCUMENTS

CN    103207819 A    7/2013
TW    201303587 A1   1/2013
(Continued)

OTHER PUBLICATIONS

A. Scade and S. Schmutz, "DfT support for serial non-volatile sRAM's," 2011 Semiconductor Conference Dresden, Dresden, 2011, pp. 1-4. (Year: 2011).*

(Continued)

*Primary Examiner* — Cynthia Britt
(74) *Attorney, Agent, or Firm* — Winston Hsu

(57) ABSTRACT

A storage device and an interface chip thereof are provided, wherein the interface chip can be applied to the storage device. The interface chip comprises a slave interface circuit, a master interface circuit, and a control circuit. The storage device comprises a memory controller and a non-volatile (NV) memory, and the NV memory comprises a plurality of NV memory chips. The slave interface circuit is arranged for coupling the interface chip to the memory controller. The master interface circuit is arranged for coupling the interface chip to a set of NV memory chips within the plurality of NV memory chips. A hierarchical architecture in the storage device comprises the memory controller, the interface chip, and the set of NV memory chips. The control circuit is arranged for controlling operations of the interface chip.

24 Claims, 10 Drawing Sheets

(52) U.S. Cl.
CPC ...... *G06F 11/1012* (2013.01); *G06F 11/1068* (2013.01); *G11C 29/52* (2013.01)

(56) References Cited

U.S. PATENT DOCUMENTS

| | | | |
|---|---|---|---|
| 8,310,880 B2 | 11/2012 | Kuehne | |
| 8,516,172 B1 | 8/2013 | Karamcheti | |
| 8,639,863 B1 | 1/2014 | Kanapathippillai | |
| 9,093,150 B2 | 7/2015 | Karamcheti | |
| 9,152,496 B2* | 10/2015 | Kanade | G06F 11/1068 |
| 9,507,529 B2 | 11/2016 | Danilak | |
| 2007/0045425 A1 | 3/2007 | Yoshida | |
| 2008/0250192 A1* | 10/2008 | Pua | G06F 13/385 |
| | | | 711/103 |
| 2011/0153903 A1 | 6/2011 | Hinkle | |
| 2012/0144102 A1 | 6/2012 | Langlois | |
| 2013/0007384 A1 | 1/2013 | Larson | |
| 2013/0124932 A1 | 5/2013 | Schuh | |
| 2013/0290606 A1 | 10/2013 | Alessi | |
| 2016/0253268 A1 | 9/2016 | Danilak | |
| 2016/0321002 A1 | 11/2016 | Jung | |
| 2018/0137909 A1* | 5/2018 | Shaeffer | H01L 25/0652 |

FOREIGN PATENT DOCUMENTS

| | | |
|---|---|---|
| TW | 201432696 A | 8/2014 |
| TW | 201512843 A | 4/2015 |

OTHER PUBLICATIONS

Amro Awad et al., "Non-volatile memory host controller interface performance analysis in high-performance I/O systems," 2015 IEEE, 2015, pp. 145-154.

* cited by examiner

STORAGE DEVICE AND INTERFACE CHIP THEREOF

CROSS REFERENCE TO RELATED APPLICATIONS

This application is a continuation application and claims the benefit of U.S. Non-provisional application Ser. No. 16/048,348, which was filed on Jul. 30, 2018, and is included herein by reference.

BACKGROUND OF THE INVENTION

1. Field of the Invention

The present invention relates to flash memory control, and more particularly, to a storage device and an interface chip thereof.

2. Description of the Prior Art

Some problems have arisen in the related art regarding the development of solid state drive (SSD) products with high performance and high durability such as enterprise SSD. For example, when attempting to increase the storage capacity of an enterprise SSD by increasing the number of flash memory chips in the enterprise SSD, the throughput of a key data path of a controller in the enterprise SSD will greatly increase, but the conventional architecture of the controller is not able to afford such a large throughput. As the conventional technologies are not able to ensure both performance and reliability at the same time, tradeoffs between the performance and the reliability must be considered. For another example, the increase of calculation for related data protection can lead to high temperature of the controller. Therefore, an additional heat dissipation mechanism is required for the controller, wherein the heat dissipation mechanisms will occupy additional space. Therefore, there is a need for an innovational architecture to break the bottleneck in the development of this type of storage devices.

SUMMARY OF THE INVENTION

It is therefore one of the objectives of the present invention to provide a storage device and an interface chip thereof to solve the above problems.

Another object of the present invention is to provide a storage device and an interface chip thereof to maximize the storage capacity of the storage device while ensuring the efficiency and reliability of the storage device.

According to a first aspect of the present invention, an exemplary interface chip is disclosed, wherein the interface chip is applied to a storage device. The interface chip comprises a slave interface circuit, a master interface circuit, and a control circuit coupled between the slave interface circuit and the master interface circuit. The slave interface circuit is utilized for coupling the interface chip to a memory controller, wherein the storage device comprises the memory controller and a non-volatile (NV) memory, and the NV memory comprises a plurality of NV memory chips; the memory controller accesses the NV memory through the interface chip in response to a host device command from a host device, and the host device is located outside of the storage device. The master interface circuit is utilized for coupling the interface chip to a set of NV memory chips in the plurality of NV memory chips, wherein a hierarchical structure in the storage device comprises the memory controller, the interface chip, and the set of NV memory chips. The control circuit is coupled between the slave interface circuit and the master interface circuit, and utilized for controlling operations of the interface chip, wherein the interface chip accesses the set of NV memory chips for the memory controller under the control of the control circuit.

According to a second aspect of the present invention, an exemplary storage device is disclosed. The storage device comprises: a NV memory, wherein the NV memory comprises a plurality of NV memory chips; a memory controller; and a plurality of interface chips, coupled between the memory controller and the NV memory. The NV memory can be utilized to store information, and the memory controller can be utilized to control operations of the storage device. In addition, anyone of the plurality of interface chips comprises a slave interface circuit, a master interface circuit, and a control circuit coupled between the slave interface circuit and the master interface circuit. The slave interface circuit is utilized for coupling the interface chip to a memory controller, wherein the memory controller accesses the NV memory through the interface chip in response to a host device command from a host device, and the host device is located outside of the storage device. The master interface circuit is utilized for coupling the interface chip to a set of NV memory chips in the plurality of NV memory chips, wherein a hierarchical structure in the storage device comprises the memory controller, the interface chip, and the set of NV memory chips. The control circuit is coupled between the slave interface circuit and the master interface circuit, and utilized for controlling operations of the interface chip, wherein the interface chip accesses the set of NV memory chips for the memory controller under the control of the control circuit.

According to a third aspect of the present invention, an exemplary interface chip is disclosed, wherein the interface chip is applied to a storage device. The interface chip comprises a slave interface circuit, a plurality of bypass interface circuits, and a control circuit coupled between the slave interface circuit and the plurality of bypass interface circuits. The slave interface circuit can be utilized to couple the interface chip to a memory controller, wherein the storage device comprises the memory controller and a NV memory, and the NV memory comprises a plurality of NV memory chips. The memory controller can access the NV memory through the interface chip in response to a command from a host device, and the host device is located outside of the storage device. The plurality of bypass interface circuits are utilized for respectively coupling the interface chips to a plurality of other interface chips in the storage device, wherein the plurality of other interface chips are respectively coupled to a plurality of sets of NV memory chips in the plurality of NV memory chips. The control circuit can be utilized for controlling operations of the interface chip. Under the control of the control circuit, the interface chip bypasses at least one of at least a command and the data between the memory controller and the plurality of other interface chips, and accesses the plurality of sets of NV memory chips for the memory controller through the plurality of other interface chips.

According to a fourth aspect of the present invention, an exemplary storage device is disclosed. The storage device comprises: a NV memory, wherein the NV memory comprises a plurality of NV memory chips; a memory controller; and a plurality of interface chips, coupled between the memory controller and the NV memory, wherein the plurality of interface chips comprises a plurality of first layer interface chips and a plurality of second layer interface chips. The NV memory can be utilized to store information, and the memory controller can be utilized to control operations of the storage device. In addition, any one of the plurality of first layer interface chips comprises a slave interface circuit, a plurality of bypass interface circuits, and a control circuit coupled between the slave interface circuit and the plurality of bypass interface circuits. The slave interface circuit can be utilized to couple the interface chip to the memory controller, wherein the memory controller can access the NV memory through the interface chip in response to a host device command from a host device, and the host device is located outside of the storage device. The plurality of bypass interface circuits can be utilized to respectively couple the interface chip to a plurality of other interface chips, wherein the plurality of other interface chips are a set of second layer interface chips of the plurality of second layer interface chips, and the plurality of other interface chips are respectively coupled to a plurality of sets of NV memory chips within the plurality of NV memory chips. The control circuit can be utilized for controlling operations of the interface chip. Under the control of the control circuit, the interface chip bypasses at least one of the command and the data between the memory controller and the plurality of other interface chips, and accesses the plurality of sets of NV memory chips for the memory controller through the plurality of other interface chips.

One of the advantages of the present invention is that the interface chip of the present invention increases the storage capacity of the storage device and avoids various problems in the related art. In addition, the interface chip of the present invention can ensure the efficiency and reliability of the storage device. In addition, the interface chip and the storage device of the present invention can perform multi-layer data protection so as to effectively reduce the uncorrectable bit error rate (UBER) of the storage device.

These and other objectives of the present invention will no doubt become obvious to those of ordinary skill in the art after reading the following detailed description of the preferred embodiment that is illustrated in the various figures and drawings.

DETAILED DESCRIPTION

In the related art, the term "chip" can represent a bare chip (e.g. die) or at least one die protected in a package. For better comprehension, the term "chip" in the present invention can represent a die of an integrated circuit (IC). For example, the term "non-volatile (NV) memory chip" can represent a die of a NV memory IC. For another example, the term "flash chip" can represent a die of a flash memory IC. As another example, the term "interface chip" can represent a die of an interfacing IC. According to some embodiments, one or more chips (such as one or more dice) can be disposed in a package.

Figure 1:
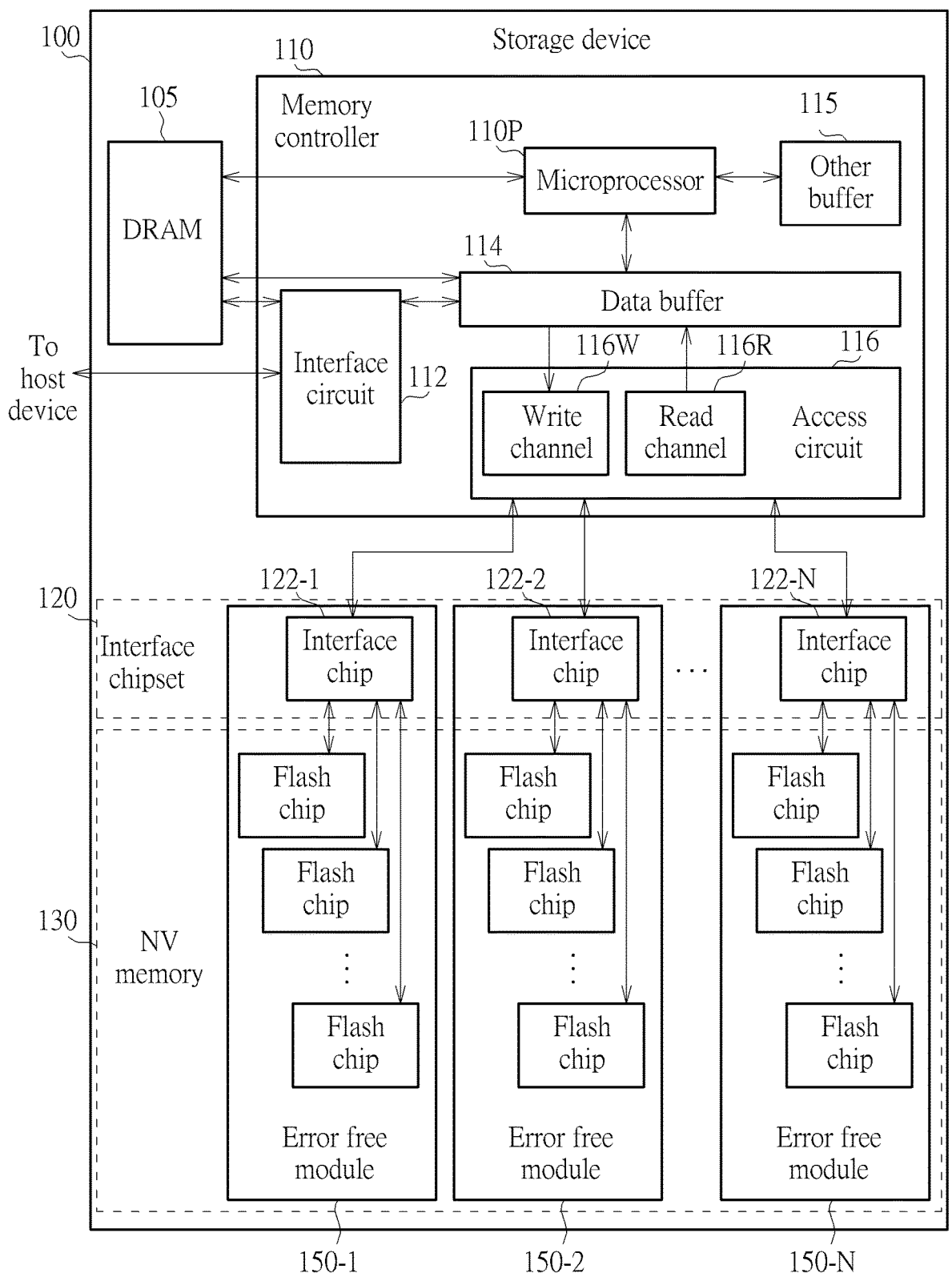
FIG. 1 is a schematic diagram of a storage device according to an embodiment of the present invention.

FIG. 1 is a schematic diagram of a storage device 100 according to an embodiment of the present invention. For example, the storage device 100 can be a solid state drive (SSD), such as an enterprise SSD. As shown in FIG. 1, the storage device 100 comprises a Dynamic Random Access Memory (DRAM) 105, a memory controller 110, an interface chipset 120, and a NV memory 130. The memory controller 110 comprises a microprocessor 110P, an interface circuit 112, a data buffer 114, at least one other buffer 115, and an access circuit 116. The access circuit 116 can comprise a plurality of sub-circuits, such as a read channel circuit 116R and a write channel circuit 116W (labeled as "read channel" and "write channel" in FIG. 1). The microprocessor 110P can control various components in the memory controller 110, such as the interface circuit 112, the data buffer 114, the other buffers 115, and the access circuit 116. The interface chipset 120 comprises interface chips 122-1, 122-2, . . . , and 122-N, and the NV memory 130 comprises a plurality of NV memory chips, such as a plurality of flash memory chips, which can be referred to as flash chips, for brevity, wherein the symbol "N" can represent a positive integer greater than one. For example, N=16; for another example, N=8; for another example, N can be equal to any of other values as long as the implementation of the present invention is not hindered.

According to this embodiment, the NV memory 130 (for example, the NV memory chips such as the flash chips) can be utilized for storing information, and the memory controller 110 can be utilized for controlling operations of the storage apparatus 100. In addition, the interface chips 122-1, 122-2, . . . , and 122-N respectively access the NV memory chips, such as the flash chips for the memory controller 110 to perform error correction. The data error has been corrected before the data is transmitted to the memory controller 110 from one or more of the flash chips. Therefore, the interface chipset 120 can control the NV memory 130 to provide a plurality of error free modules 150-1, 150-2, . . . , and 150-N for the memory controller 110, wherein any error free module 150-n of the error free modules 150-1, 150-2, . . . , and 150-N can provide error free data to the memory controller 110 and the symbol "n" can represent a positive integer in the interval [1, N]. According to this embodiment, the error free module 150-1 comprises the interface chip 122-1 and a plurality of flash chips coupled to the interface chip 122-1, the error free module 150-2 comprises the interface chip 122-2, and a plurality of flash chips coupled to the interface chip 122-2, and so on. The error free module 150-N comprises the interface chip 122-N and a plurality of flash chips coupled to the interface chip 122-N.

Based on the architecture shown in FIG. 1, a hierarchical architecture in the storage device 100 comprises a memory controller 110, interface chips {122-1, 122-2, ..., 122-N} and error free modules {150-1, 150-2, ..., 150-N}. In addition, the storage device 100 can be coupled to a host device; the host device (not shown) is located outside of the storage device 100. The memory controller 110 can access the NV memory 130 through any interface chip 122-n of the interface chips 122-1, 122-2, ..., and 122-N in response to a host device command from the host device. For example, the host device can be a server, such as a storage server, wherein the storage device 100 can be regarded as a storage system in the server. In addition, when the host device accesses the storage device 100, the host device can send a logical address to the storage device 100 to indicate the data to be accessed by the host device. The memory controller 110 can convert the logical address of the host device into a physical address and then transmit the physical address to the interface chip 122-n to access the data in the NV memory 130. In addition, the memory controller 110 can be provided with encoding and decoding functions of Cyclic Redundancy Check code (CRC code), and can perform the CRC code encoding/decoding operation as needed to check the correctness of the data.

Figure 2:
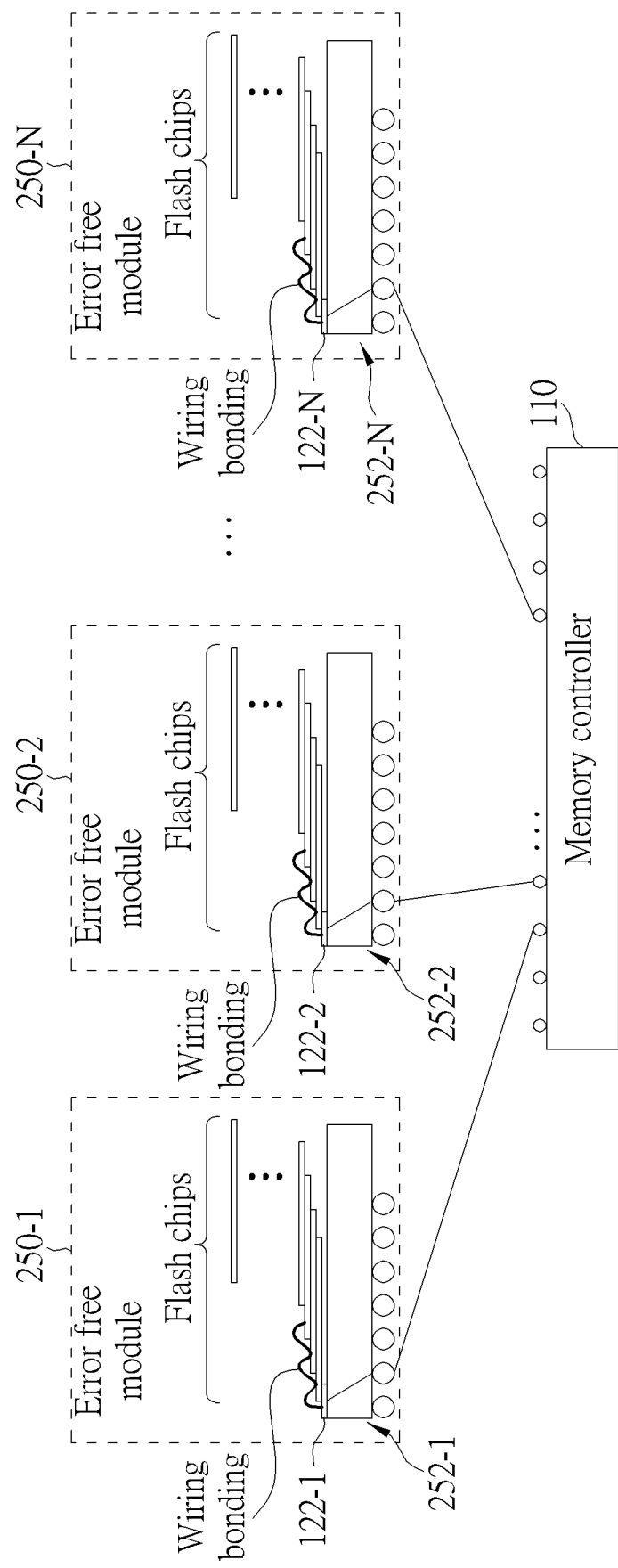
FIG. 2 shows the implementation details of the storage device shown in FIG. 1 according to an embodiment of the present invention.

FIG. 2 shows the implementation details of the storage device 100 shown in FIG. 1 according to an embodiment of the present invention. According to this embodiment, the error free modules 150-1, 150-2, ..., and 150-N can be respectively implemented as error free modules 250-1, 250-2, ..., and 250-N with packages. For better comprehension, the bases 252-1, 252-2, ..., and 252-N of the packages are respectively shown under the flash chips. A chip stack formed by a plurality of flash chips can be disposed on any base 252-n of the bases 252-1, 252-2, ..., and 252-N. Each flash chip can be coupled to the interface chip 122-n through wire/wiring bonding. For example, the chip stack can comprise 16 flash chips. As another example, the chip stack can comprise 8 flash chips, or other numbers of flash chips. When there is a requirement, the interface chip 122-n can use a chip enable (CE) signal to control whether or not to enable a flash chip. Under the control of the memory controller 110, the storage device 100 can have a plurality of channels such as N channels Ch(0), Ch(1), ..., and Ch(N-1), wherein each channel can have an error free module. For channel Ch(n-1), memory controller 110 can access any of the flash chips in the chip stack on base 252-n through the interface chip 122-n. For example, when N=16 and the chip stack comprises 16 flash chips, the memory controller 110 can access 256 flash chips through the interface chipset 120. Please note that the architecture of these error free modules can be changed. According to some embodiments, a plurality of interface chip can be provided in one package. For example, one chip stack on the base of the package can comprise 8 flash chips, and two interface chips can be provided on the base. The two interface chips can be respectively coupled to the upper four flash chips and the lower four flash chips in the chip stack, and the memory controller 110 can access the chip stack respectively through the two interface chips. According to some embodiments, each of the plurality of channels can correspond to a plurality of interface chip. For example, the value N can be a multiple of the channel count of the plurality of channels.

Compared with the related art, the interface chip of the present invention can reduce the channel capacitance. For example, the related art is limited to 8 flash chips per channel due to the high channel capacitance, wherein a typical channel capacitance can be up to 20 pF (picofarad). Based on the architecture of the present invention, up to 32 flash chips can be implemented per channel with a typical channel capacitance of approximately 5 pF.

According to some embodiments, a plurality of chip stacks and a plurality of interface chips can be disposed in a package, and each of the plurality of chip stacks comprises a plurality of flash chips, wherein a portion of the plurality of interface chips can respectively be coupled to the chip stacks, and the other interface chip of the interface chips can be coupled between the memory controller 110 and the portion of the interface chips. Under the control of the memory controller 110, the storage device 100 can have N channels Ch(0), Ch(1), ..., and Ch(N-1), wherein all the flash chips in this package can operate on any one of the N channels, and the other interface chip can access the flash chips on the channel for the memory controller 110 through the portion of the interface chips.

Figure 3:
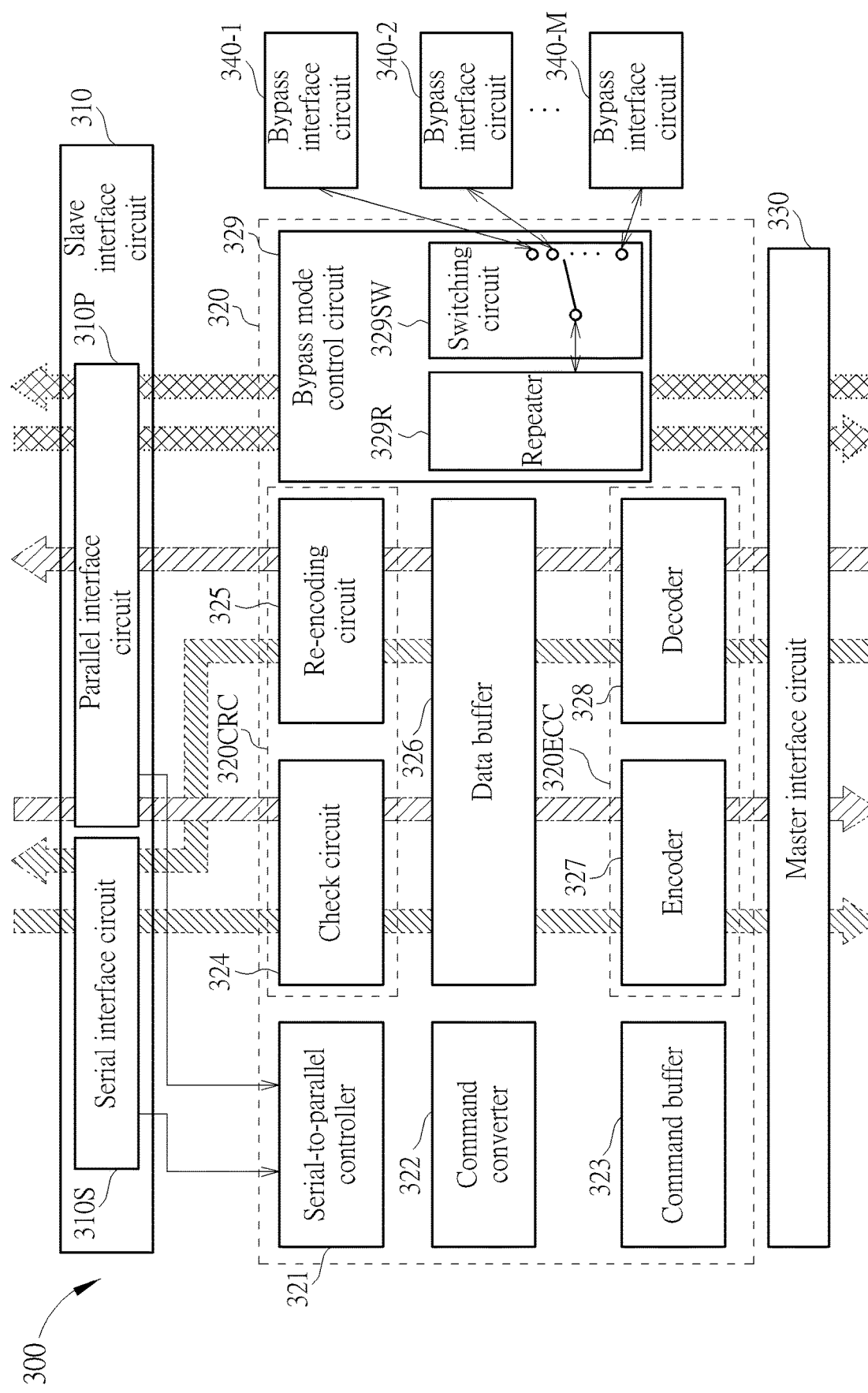
FIG. 3 is a schematic diagram of an interface chip according to an embodiment of the present invention, wherein the interface chip is applicable to the storage device shown in FIG. 1.

FIG. 3 is a schematic diagram of an interface chip 300 according to an embodiment of the present invention. The interface chip 300 can be applied to the storage device 100 shown in FIG. 1. The interface chip 300 can serve as an example of any interface chip 112-n of the in the interface chips {122-1, 122-2, ..., 122-N}, and the interface chip 300 can be coupled to a set of NV memory chips in the plurality of NV memory chips, such as those flash chips in an error free modules 150-n. Thus, the hierarchical architecture can comprise the memory controller 110, the interface chip 300, and the set of NV memory chips. For better comprehension, in a situation where the interface chip 112-n is implemented as the interface chip 300, the other interface chips except the interface chip 112-n among the interface chips {122-1, 122-2, ..., 122-N} can be implemented as having the same circuit architecture as the interface chip 300. For example, the interface chips {122-1, 122-2, ..., 122-N} can be the same model of products, such as products having the same circuit design and generated in the same process and the same conditions. These products can be considered products that are identical to each other, wherein the possible minor differences between these products (due to process and so on) are ignored. Assuming that the interface chip 300 represents one of the plurality of interface chips {300} and the plurality of interface chips {300} represent the same model of products, the plurality of interface chips {300} can function as an example of the interface chips {122-1, 122-2, ..., 122-N}. In addition to the memory controller 110, the interface chip 300, and the set of NV memory chips, the hierarchical architecture can further comprise multiple other interface chips of the plurality of interface chips {300}, and further comprise other sets of NV memory chips in the plurality of NV memory chips, such as those flash chips in other error free modules of error free modules {150-1, 150-2, ..., 150-N}, wherein the other interface chips can be respectively coupled between the memory controller 110 and the other sets of NV memory chips.

As shown in FIG. 3, the interface chip 300 comprises a slave interface circuit 310, a control circuit 320, a master interface circuit 330 and a number M of bypass interface circuits {340-1, 340-2, ..., 340-M}, wherein the symbol "M" can represent a positive integer greater than one. The control circuit 320 is coupled between the slave interface circuit 310 and the master interface circuit 330 to manage a plurality of command paths and data paths between the slave interface circuit 310 and the master interface circuit 330 such as six shaded vertical paths shown in FIG. 3. The slave interface circuit 310 comprises a parallel interface circuit 310P and a serial interface circuit 310S, and the serial interface circuit 310S can be a serializer/deserializer (SerDes) circuit. In addition, the control circuit 320 comprises a serial-to-parallel controller 321, a command converter 322, a command buffer 323, a Cyclic Redundancy Check (CRC) circuit 320CRC, a data buffer 326, an Error Correction Code (ECC) circuit 320ECC, and a bypass mode control circuit 329. The CRC circuit 320CRC comprises a check circuit 324 and a re-encoding circuit 325, and the ECC circuit 320ECC comprises an encoder 327 and a decoder 328, and the bypass mode control circuit 329 comprises a repeater 329R and a switching circuit 329SW. The serial-to-parallel controller 321 can control the conversion operation between the serial data and the parallel data. The command buffer 323 can be utilized to buffer commands from the memory controller 110, and the command converter 322 can convert the commands or respond to the memory controller 110 when it is needed. The data buffer 326 can be utilized to buffer data, and CRC circuit 320CRC and ECC circuit 320ECC can perform operations of data protection. The bypass mode control circuit 329 controls operations of the data/command bypass. Based on these mechanisms, the interface chip 300 can self-administer the set of NV memory chips in response to the request of the memory controller 110.

According to this embodiment, the slave interface circuit 310 can be utilized to couple the interface chip 300 to the memory controller 110, and the master interface circuit 330 can be utilized to couple the interface chip 300 to the set of NV memory chips, such as the flash chip in the error free module 150-$n$. The control circuit 320 can control operations of the interface chip 300. Under the control of the control circuit 320, the interface chip 300 can access the set of NV memory chips for the memory controller 110. For example, when the memory controller 110 has a parallel transmission capability, the interface chip 300 can communicate with the memory controller 110 via the parallel interface circuit 310P. Two of the six vertical paths pass through the parallel interface circuit 310P, the CRC circuit 320CRC and the ECC circuit 320ECC, and the downward path and the upward path of the two paths correspond to the write operation and the read operation, respectively. For another example, when the memory controller 110 is capable of serial transmission, the interface chip 300 can communicate with the memory controller 110 via the serial interface circuit 310S. Two of the six vertical paths pass through the serial interface circuit 310S, the CRC circuit 320CRC and the ECC circuit 320ECC, and the downward path and the upward path of the two paths correspond to the write operation and the read operation, respectively. The data from the memory controller 110 can be serial transmission data. The serial interface circuit 310S (for example, the serializer/deserializer circuit) can deserialize the serial transmission data for use by the interface chip 300 (deserialization) and can serialize the parallel transmission data in the interface chip 300 (serialization) for transmission to the memory controller 110.

In addition, the ECC circuit 320ECC can perform an ECC-related operation, in which the control circuit 320 can utilize the ECC circuit 320ECC to perform the ECC-related operations for the memory controller 110 to correct at least a portion of data errors. The control circuit 320 (e.g. the ECC circuit 320ECC) can perform, for the memory controller 110, at least one portion of operations of soft decoding, hard decoding, error recovery control, read error handling, read retry, threshold voltage tracking ("Vth tracking"), . . . , and so on, so as to obtain a correctable code word for correcting the data errors, to obtain the error free data. According to this embodiment, the ECC calculation capability of the interface chip 300 is higher than the ECC calculation capability of the memory controller 110. For example, the memory controller 110 can have the capability to detect and correct errors through ECC calculation operations, and the error bit count that the interface chip 300 can correct when performing ECC calculation operations is higher than the error bit count that the memory controller 110 can correct when performing the ECC calculation operation. As another example, the memory controller 110 can have the capability to detect an error through an ECC calculation operation rather than correct the error through an ECC calculation operation, wherein regarding error correction, the memory controller 110 can rely on the interface chip 300 for ECC calculation capability. Regardless of whether the memory controller 110 has the capability to correct errors through the ECC calculation operations, with aid of the ECC circuit 320ECC, the control circuit 320 enables the combination of the interface chip 300 and the set of NV memory chips (such as the flash chips in the error free module 150-$n$) for the memory controller 110 as an error free NV memory chipset. According to some embodiments, the interface chip 300 and the set of NV memory chips (such as the flash chips in the error free modules 150-$n$) can be located within a package. With aid of the ECC circuit 320ECC, the interface chip 300 makes the package for the memory controller 110 as an error free NV memory chip package.

Please note that the architecture of the memory controller 110 can be varied and the interface chip 300 can be designed as a multi-functional chip to accommodate various possible changes in the architecture of the memory controller 110. For example, when the memory controller 110 transmits data and a parity-check code of the data to the interface chip 300, the control circuit 320 can discard the parity-check code and use the ECC circuit 320ECC (especially the encoder 327 therein) to generate a new parity-check code based on the data, and write the data and the new parity-check code into at least one NV memory chip in the set of NV memory chips (such as the flash chips of the error free module 150-$n$). For another example, when the memory controller 110 transmits data to the interface chip 300, the control circuit 320 can generate a parity-check code according to the data by using the ECC circuit 320ECC (especially the encoder 327 therein), and write the parity-check code and the data to at least one NV memory chip in the set of NV memory chips (such as the flash chips in the error free module 150-$n$).

In addition, the CRC circuit 320CRC can perform a CRC-related operation, where the control circuit 320 may use the CRC circuit 320CRC to check the correctness of the data from the memory controller 110. For example, the host device command can be a host device write command. According to the host device write command, the memory controller 110 transmits the data and a CRC code of the data to the interface chip 300. The CRC circuit 320CRC (especially the check circuit 324 therein) can perform a CRC calculation on the data to generate a calculation result. When the calculation result is identical to the CRC code, the control circuit 320 can generate a parity-check code according to the data by using the ECC circuit 320ECC (especially the encoder 327 therein) and transmit a write command to at least one NV memory chip in the set of NV memory chips (such as the flash chips in the error free module 150-$n$)

through the master interface circuit 330, to write the data and the parity-check code into the at least one NV memory chip; otherwise, the control circuit 320 can request the memory controller 110 to retransmit the data and the CRC code. For another example, the host device command can be a host device read command. According to the host device read command, the memory controller 110 requests the interface chip 300 to perform a corresponding reading operation. In the corresponding reading operation, the control circuit 320 transmits a read command to at least one NV memory chip in the set of NV memory chips (such as the flash chips in the error free module 150-*n*) through the master interface circuit 330, so that the at least one NV memory chip transmits the read data corresponding to the read command and a parity-check code of the read data to the interface chip 300. The control circuit 320 can utilize the ECC circuit 320ECC (especially the decoder 328 therein) to correct any error in the read data according to the read data and the parity-check code to obtain error free data. The CRC circuit 320CRC (especially the re-encoding circuit 325 therein) can perform a CRC on the error free data to generate a CRC code to allow the memory controller 110 to check the correctness of the error free data according to the CRC code when obtaining (for example, reading) the error free data from the interface chip 300, wherein the CRC code can ensure that the error free data is correctly received. The memory controller 110 can check whether the error free data is correctly received according to the CRC code. If there is an error, the memory controller 110 can retrieve (for example, re-read) the error free data and the CRC code from the interface chip 300.

As mentioned above, the interface chip 300 can be designed as a multi-function chip. The control circuit 320 (for example, the bypass mode control circuit 329) is coupled between the slave interface circuit 310 and the M bypass interface circuits {340-1, 340-2, ..., 340-M} to control the interface chip 300 of the operation. In a bypass mode of the interface chip 300, the bypass mode control circuit 329 can bypass the command and data through the corresponding bypass paths, and the repeater 329R can amplify the signal strength on the bypass paths. For example, the two right-side paths of the six vertical paths pass through the parallel interface circuit 310P, the repeater 329R and the master interface circuit 330, and the downward path and the upward path of the two paths respectively correspond to the write operation and the read operation, wherein these two paths can be examples of these bypass paths. For another example, the switching circuit 329SW can perform a switching operation to couple the bypass paths to any bypass interface circuit 340-*m* of the M bypass interface circuits {340-1, 340-2, ..., 340-M}, wherein the symbol "m" can represent a positive integer falling within the interval [1, M]. Thus, the bypass paths can pass through the parallel interface circuit 310P, the repeater 329R, the switching circuit 329SW, and the bypass interface circuit 340-*m*. Please note that this bypass mode can also be applied to the serial transmission. For example, the bypass paths can pass through the serial interface circuit 310S, the repeater 329R, and the master interface circuit 330. For another example, the bypass paths can pass through the serial interface circuit 310S, the repeater 329R, the switching circuit 329SW, and the bypass interface circuit 340-*m*.

Under the control of the control circuit 320 (for example, the bypass mode control circuit 329), the interface chip 300 can bypass a command from the memory controller 110 to an NV memory chip in the set of NV memory chips in the bypass mode (for example, bypassing data from the memory controller 110 to the NV memory chip during a writing operation of the storage device 100, bypassing data from the NV memory chip to the memory controller 110 during a reading operation of the storage device 100).

Figure 4:
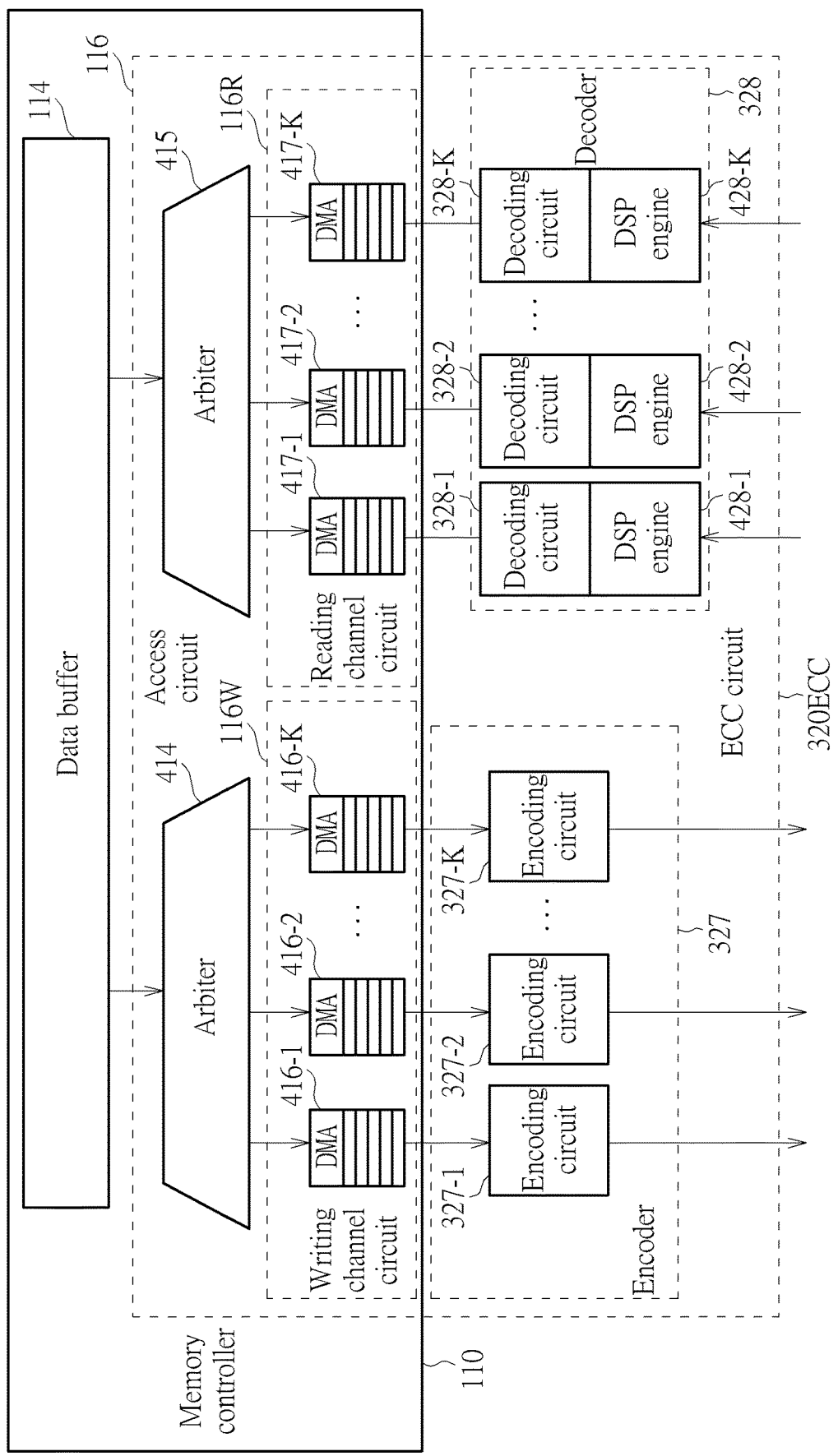
FIG. 4 shows a data processing scheme of the interface chip shown in FIG. 3 according to an embodiment of the present invention.

FIG. 4 shows a data processing scheme of the interface chip 300 shown in FIG. 3 according to an embodiment of the present invention. The sub-circuits of the access circuit 116 can comprise arbiters 414 and 415, and further comprise a plurality of direct memory access circuits (DMA circuits), such as two sets of DMA circuits {416-1, 416-2, ..., 416-K} and {417-1, 417-2, ..., 417-K} respectively in the writing channel circuit 116W and the reading channel circuit 116R. For simplicity, these two sets of DMA circuits can be labeled "DMA" in FIG. 4. The arbiter 414 can control operations of the set of DMA circuits {416-1, 416-2, ..., 416-K} to transmit data from data buffer 114 to interface chip 300. The arbiter 415 can control operations of the DMA circuits 417-1, 417-2, ..., 417-K to obtain the data from the interface chip 300 and temporarily store the data in the data buffer 114. As shown in FIG. 4, a portion of the circuit of the interface chip 300, such as the ECC circuit 320ECC, can be coupled to the access circuit 116 of the memory controller 110. For the sake of simplicity, other parts of the interface chip 300 are not shown in FIG. 4. For example, the set of DMA circuits {416-1, 416-2, ..., 416-K} can write data to the data buffer 326 through the slave interface circuit 310. When the data is received from the set of DMA circuits {416-1, 416-2, ..., 416-K} through the slave interface circuit 310, the interface chip 300 can buffer the data in the data buffer 326 and use the check circuit 324 to check whether the data is correctly received. When the result of the check indicates that the data is correctly received, the interface chip 300 can encode the data using the encoder 327. For another example, the interface chip 300 can decode the code words from the set of NV memory chips (such as the flash chips in the error free modules 150-*n*) by using the decoder 328 to obtain the correct read data and buffer the read data in the data buffer 326, and can generate a corresponding CRC code by using the re-encoding circuit 325 to protect the read data. Thus, the set of DMA circuits {417-1, 417-2, ..., 417-K} can read the protected read data in the data buffer 326 through the slave interface circuit 310.

According to the present embodiment, the encoder 327 can comprise a set of encoding circuits {327-1, 327-2, ..., 327-K} respectively corresponding to the set of DMA circuits {416-1, 416-2, ..., 416-K}, and the decoder 328 can comprise a set of decoding circuits {328-1, 328-2, ..., 328-K} respectively corresponding to the set of DMA circuits {417-1, 417-2, ..., 417-K}} and a set of digital signal processing engines (DSP engines) {428-1, 428-2, ..., 428-K}. For example, the set of NV memory chips (such as the flash chips in the error free modules 150-*n*) can comprise a number K of flash chips, which can be coupled to the set of encoding circuits {327-1, 327-2, ..., 327-K} through the master interface circuit 330, and also can be coupled to the set of DSP engines {428-1, 428-2, ..., 428-K} through the master interface circuit 330. In addition, the set of encoding circuits {327-1, 327-2, ..., 327-K} can respectively perform the ECC encoding operation on the data to be written into the K flash chips to generate respective parity-check codes of the data, and respectively write corresponding code words into the K flash chips to protect the data, wherein the code words comprise the data and the parity-check codes. When the interface chip 300 reads the data from the K flash chips for the memory controller 110, the read data read by the interface chip 300 from the K flash chips can comprise a plurality of read versions of the code words, wherein these read versions can be wrong. When it is needed, any DSP engine 428-*k* of the set of DSP engines {428-1, 428-2, . . . , 428-K} can perform at least one operation in the aforementioned at least one portion of operations (such as soft decoding, hard decoding, error recovery control, read error handling, read retry, and/or Vth tracking) to firstly obtain a correctable code word, and enable the decoding circuit 328-*k* to successfully perform ECC decoding based on the correctable code word to correct errors, wherein the symbol "k" can represent a positive integer falling within interval [1, K]. Thus, the set of decoding circuits {328-1, 328-2, . . . , 328-K} can obtain the correct version of the data.

According to some embodiments, the decoding circuits {328-1, 328-2, . . . , 328-K} can perform low-density parity-check (LDPC) code encoding operation, and these parity-check codes can be LDPC codes.

In some embodiments, the control circuit 320 can access the K flash chips through the master interface circuit 330 according to a physical address such as a block physical address or a page physical address. For example, the memory controller 110 can specify these physical addresses during a write operation or a read operation. Thus, the interface chip 300 can access some blocks or some pages of the K flash chips for the memory controller 110 according to the physical addresses. In addition, regarding the read error handling, the control circuit 320 (for example, the ECC circuit 320ECC) can perform the ECC calculation for any word line (WL) in a plurality of WLs to provide error free data to the memory controller 110. For example, the memory controller 110 can only issue a read command to the interface chip 300 for any physical address of some physical addresses and then wait for the error free data from the interface chip 300. In addition, the control circuit 320 (for example, the ECC circuit 320ECC) can be responsible for read retries, LDPC soft decoding, and various other types of data protection operations.

Figure 5:
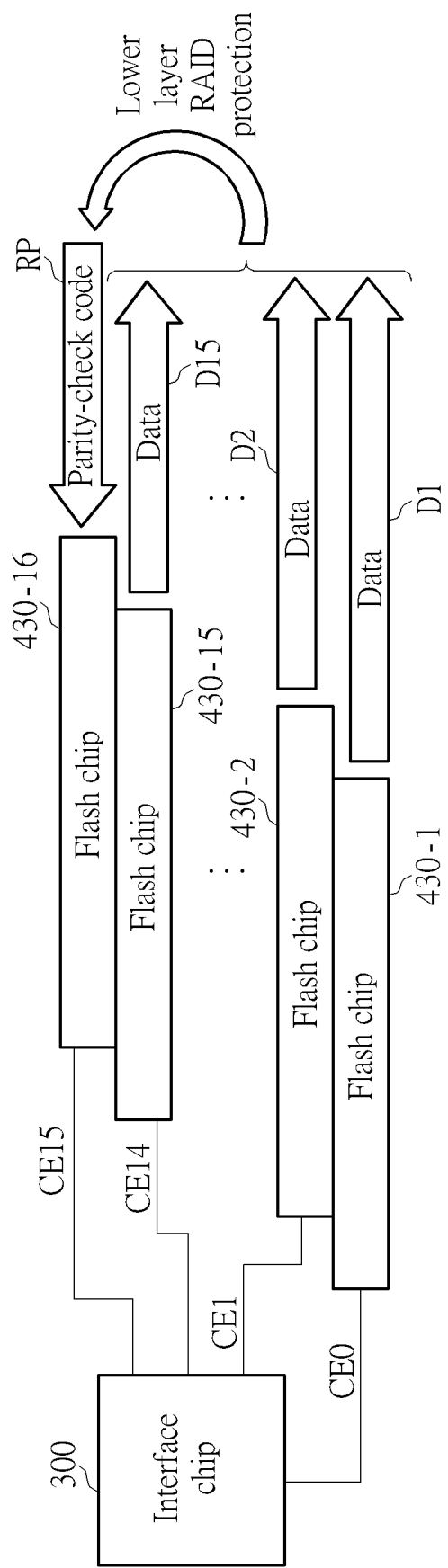
FIG. 5 shows a data protection scheme of the interface chip shown in FIG. 3 according to an embodiment of the present invention.

FIG. 5 shows a data protection scheme of the interface chip 300 shown in FIG. 3 according to an embodiment of the present invention. Under the control of the control circuit 320, the interface chip 300 can combine the set of NV memory chips (for example, the flash chips in the error free modules 150-*n*, such as the K flash chips) to become a Redundant Array of Independent Disks (RAID) to store a parity-check code of a set of data in at least one NV memory chip in the set of NV memory chips, wherein the set of data is distributed in (or over) other NV memory chips in the set of NV memory chips. For example, in the case of K=16, the K flash chips can comprise a set of flash chips {430-1, 430-2, . . . , 430-16}, and the interface chip 300 can respectively use chip enable signals CE0, CE1, . . . , and CE15 to control whether to enable the flash chips {430-1, 430-2, . . . , and 430-16}. The control circuit 320 can control the interface chip 300 to read the data {D1, D2, . . . , and D15} from the flash chips {430-1, 430-2, . . . , and 430-15}, respectively, and generate a parity-check code RP of the data {D1, D2, D1, D2, . . . , D15} according to the data {D1, D2, D1, D2, . . . , D15} and write the parity-check code RP to the flash chip 430-16 to protect the data {D1, D2, . . . , D15}, wherein the parity-check code RP can be regarded as a RAID parity-check code. For example, when any data of the data {D1, D2, . . . , D15} has an error, the interface chip 300 can correct the error according to the parity-check code RP to ensure the correctness of the data {D1, D2, . . . , D15}.

The data protection scheme shown in FIG. 5 can be respectively applied to the interface chips {122-1, 122-2, . . . , 122-N} shown in FIG. 1. Based on the data protection scheme, the interface chips {122-1, 122-2, . . . , 122-N} can respectively perform the RAID protection for the flash chips of the error free modules {150-1, 150-2, . . . , 150-N}. Therefore, in this hierarchical architecture, this data protection mechanism can be considered as lower layer RAID protection. According to some embodiments, the RAID belongs to a layer of RAIDs in the storage device 100, such as a lower layer of RAIDs. The interface chips {122-1, 122-2, . . . , 122-N} can respectively combine the flash chips of the error free modules {150-1, 150-2, . . . , 150-N} into N RAIDs) to be a number N of RAIDs, wherein the N RAIDs belong to the layer of RAIDs, and the N RAIDs comprise the RAID. In addition, the memory controller 110 can combine the plurality of NV memory chips into another layer of RAIDs, such as a higher layer of RAIDs, wherein the other layer of RAIDs (i.e. the above-mentioned another layer of RAIDs) is different from the layer of RAIDs.

Figure 6:
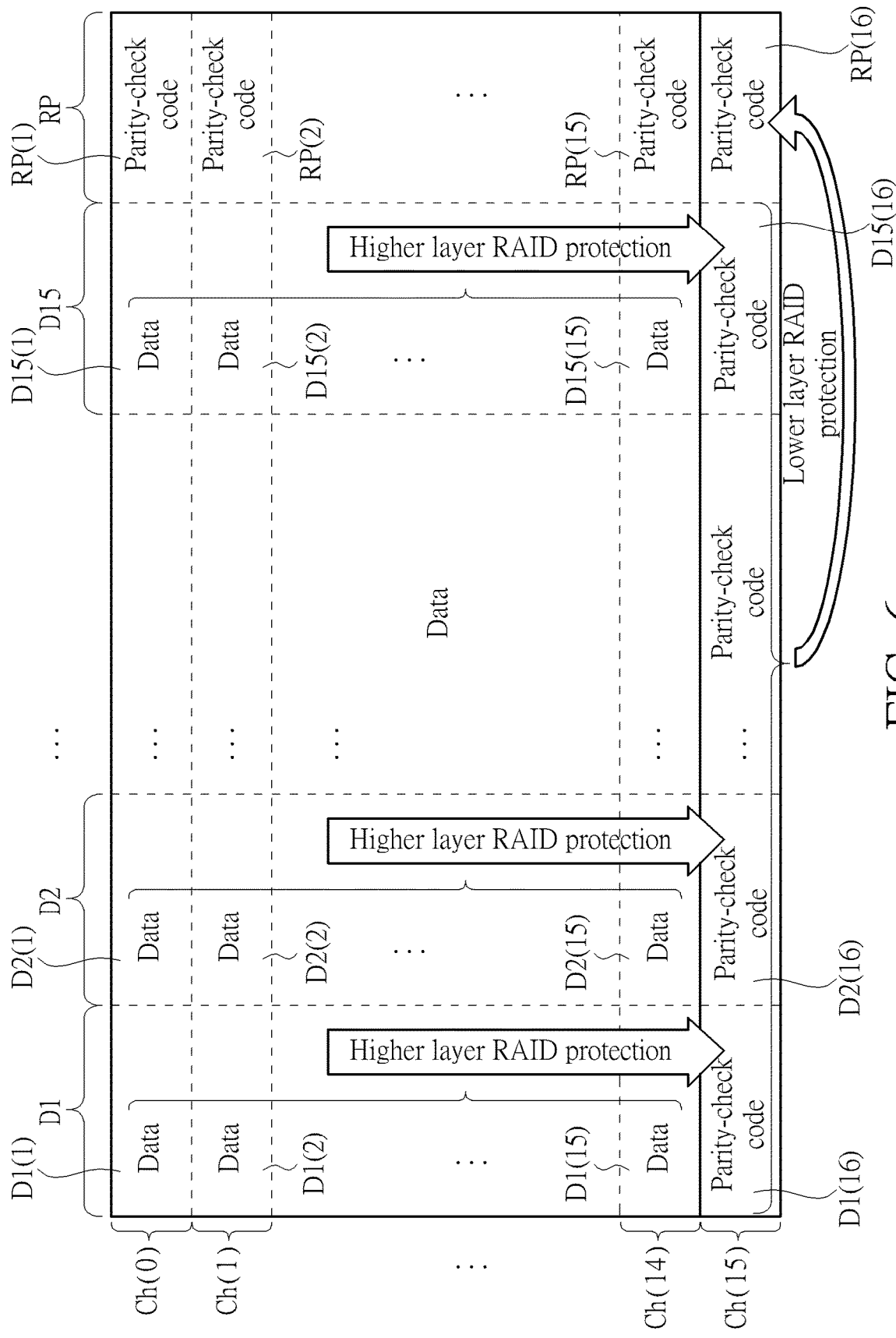
FIG. 6 shows a data protection scheme of the storage device shown in FIG. 1 according to an embodiment of the present invention.

FIG. 6 shows a data protection scheme of the storage device 100 shown in FIG. 1 according to an embodiment of the present invention. According to this embodiment, there are at least two layers of RAIDs in the storage device 100, such as the layer of RAIDs (e.g. the RAID layer comprising the N RAIDs) and the other layer of RAIDs (e.g. another RAID layer). With respect to the layer of RAIDs, any RAID of the N RAIDs can perform the lower layer RAID protection shown in FIG. 5. For example, this RAID can generate a parity-check code RP of data {D1, D2, . . . , D15} based on the data D1, D2, . . . , and D15 to protect the data {D1, D2, . . . , D15} through the parity-check code RP. In the case of K=16 and N=16, the N RAIDs such as RAIDs {RAID(0), RAID(0), . . . , RAID(15)} can respectively correspond to the channels {Ch(0), Ch), . . . , Ch(15)}. For better comprehension, the symbols "D1", "D2", . . . , "D15" and "RP" are marked at the top of FIG. 6 to indicate that the N RAIDs can perform the lower layer RAID protection shown in FIG. 5, wherein the nth RAID RAID(n−1) corresponds to the channel Ch(n−1) and generates a parity-check code RP(n) of the data {D1(*n*), D2(*n*), . . . , D15(*n*)} according to the data {D1(*n*), D2(*n*), . . . , D15(*n*)}. For example, the first RAID RAID(0) generates a parity-check code RP(1) of the data {D1(1), D2(1), . . . , D15(1)}, the second RAID RAID(1) generates a parity-check code RP(2) of the data {D1(2), D2(2), . . . , D15(2)} and the 15th RAID RAID(14) generates a parity-check code RP(15) of the data {D1(15), D2(15), . . . , D15(15)}.

With respect to the other layer of RAIDs, the memory controller 110 can perform the higher layer RAID protection. As shown in FIG. 6, the lower layer RAID protection can correspond to a data arrangement direction, such as the horizontal direction, and the higher layer RAID protection can correspond to another data arrangement direction, such as the vertical direction. The memory controller 110 can generate, according to corresponding page data such as the data of the corresponding pages in the first (N−1) RAIDs {RAID(0), RAID(1), . . . , RAID(N−2)} of the N RAIDs, the parity-check code(s) (e.g. one or more parity-check codes) of the data and use the parity-check code(s) as corresponding page data such as the data of the corresponding page (s) (e.g. one or more corresponding pages) in the Nth RAID RAID(N−1) of the N RAIDs. The Nth RAID RAID(N−1) is the 16th RAID RAID(15) in a situation where K=16 and N=16. For example, the memory controller 110 can use the parity-check code of the data {D1(1), D1(2), . . . , D1(15)} as the data D1(16), and use the parity-check code of the data {D2(1), D2(2), . . . , D2(15)} as the data D2(16), . . . , and use the parity-check code of the data {D15(1), D15(2), . . . , D15(15)} as the data D15(16). Next, the 16th RAID RAID(15) can perform the lower layer RAID protection to generates a parity-check code RP(16) based on the data {D1(16), D2(16), ..., D15(16)} (such as the parity-check codes generated by the higher layer RAID protection mechanism).

Figure 7:
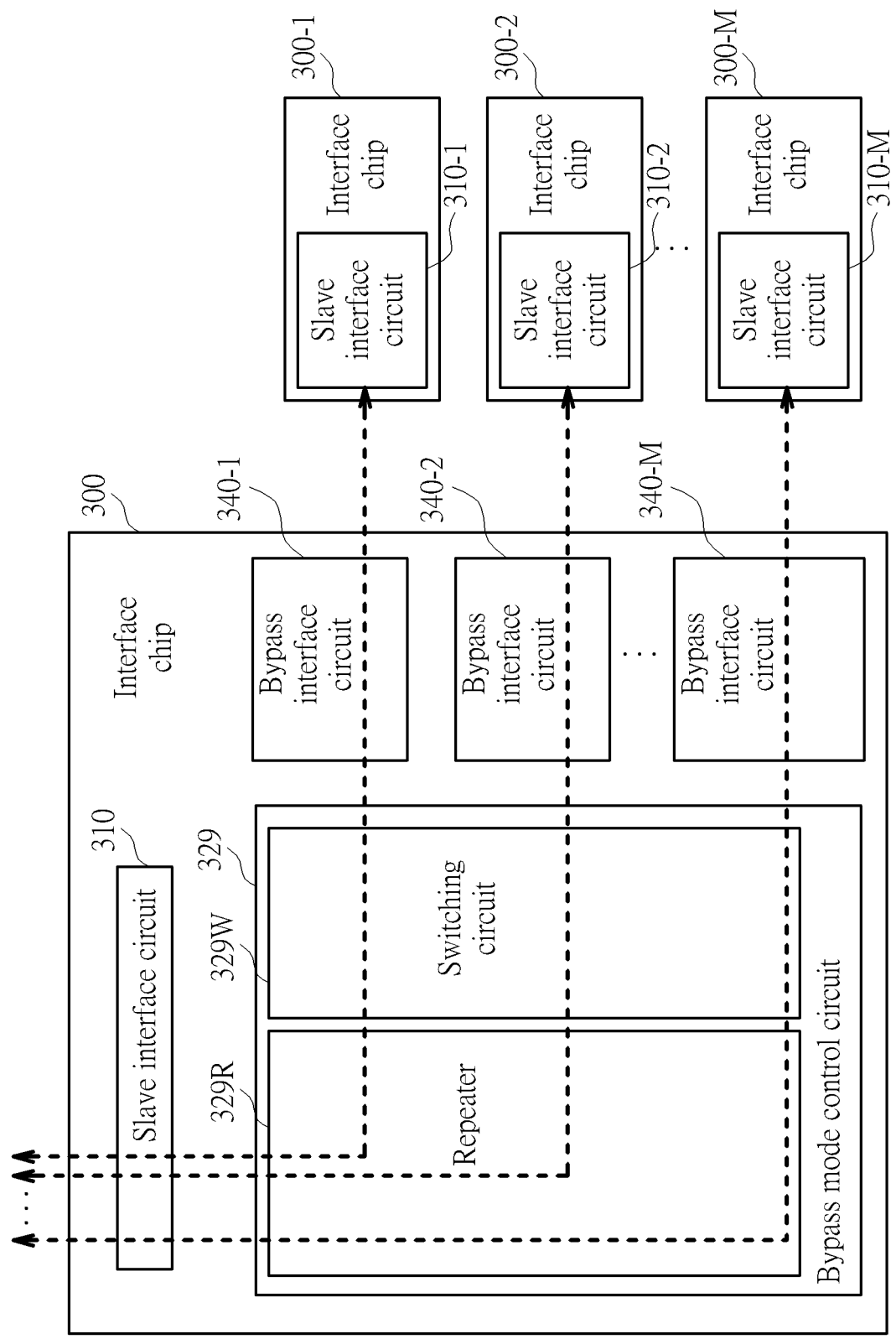
FIG. 7 shows a bypass control scheme of the interface chip shown in FIG. 3 according to an embodiment of the present invention.

FIG. 7 shows a bypass control scheme of the interface chip 300 shown in FIG. 3 according to an embodiment of the present invention. Based on this bypass control scheme, the interface chipset 120 can be replaced by a multi-layer interface chipset and the flash chips in the NV memory 130 can be extended to a larger number of flash chips in order to realize a storage device with larger storage capacity. According to this embodiment, the bypass interface circuit {340-1, 340-2, ..., 340-M} can be utilized to respectively couple the interface chip 300 to a plurality of other interface chips in the storage device, such as the interface chip {300-1, 300-2, ..., 300-M}, wherein under the control of the control circuit 320 (e.g. the bypass mode control circuit 329), the interface chip 300 bypasses at least one of at least one command and data between the memory controller 110 and the plurality of other interface chips, and accesses a plurality of sets of NV memory chips in the storage device for the memory controller 110 through the plurality of other interface chips. For example, any interface chip of the interface chips {300-1, 300-2, ..., 300-M} can have the same circuit architecture as the interface chip 300, and the respective slave interface circuits {310-1, 310-2, ..., 310-M} of the interface chips {300-1, 300-2, ..., 300-M} can be respectively coupled to the bypass interface circuits {340-1, 340-2, ..., 340-M} of the interface chip 300. The bypass paths shown by the dashed lines in FIG. 7 can serve as the examples of the bypass paths mentioned in the embodiment shown in FIG. 3. For example, a master interface circuit of any interface chip 300-m in the interface chips {300-1, 300-2, ..., 300-M} can be utilized to couple a set of NV memory chips in the sets of NV memory chips, such as a plurality of flash chips in an error free module. In this case, the layer count of the multi-layer interface chipset can be equal to two layers. For another example, a number M of bypass interface circuits of any interface chip 300-m of the interface chips {300-1, 300-2, ..., 300-M} can be respectively utilized to couple M additional interface chips (which can have the same circuit architecture as the interface chip 300, wherein the M additional interface chips and the interface chip 300 can be the same model of products, such as that having the same circuit design and manufactured under the same process and the same conditions). The M additional interface chip are coupled to more sets of NV memory chips of the plurality of sets of NV memory chips, such as a plurality of flash chips of more error free modules. In this case, the layer count of the multi-layer interface chipset can be greater than two.

According to this embodiment, a hierarchical architecture in the storage device can comprise a memory controller 110, an interface chip 300, the plurality of other interface chips (such as the interface chips {300-1, 300-2, ..., 300-M}), and the plurality of sets of NV memory chips. The interface chip 300 can be a multi-functional interface chip, and can have a plurality of functions respectively corresponding to a plurality of configurations, and the plurality of other interface chips (such as the interface chips {300-1, 300-2, ..., 300-M}) can have the same circuit architecture as the interface chip 300, wherein the plurality of other interface chips operate according to a first configuration in the plurality of configurations, and the interface chip 300 operates according to a second configuration in the plurality of configurations. For example, the plurality of other interface chips (such as the interface chips {300-1, 300-2, ..., 300-M}) and the interface chip 300 can be the same model of products, such as that having the same circuit design and with the same process and the same conditions These products can be considered as identical products to one another, with negligible potential differences between these products (due to process and so on). As can be seen from the architecture shown in FIG. 3, the master interface circuit 330 of the interface chip 300 has a NV memory chip coupling function. For example, according to the second configuration, the interface circuit 330 of the interface chip 300 is idle. For another example, according to the first configuration, a corresponding master interface circuit of any other interface chip of the plurality of other interface chips, such as the master interface circuit of any interface chips 300-m in the interface chip {300-1, 300-2, ..., 300-M} can be coupled to the set of NV memory chips in the plurality of sets of NV memory chips, to allow the other interface chip to access the set of NV memory chips (such as the flash chips in an error free module) for the memory controller 110, wherein a plurality of corresponding bypass interface circuits of the other interface chip are idle according to the first configuration.

Under the control of the memory controller 110, the storage device can have the plurality of channels, such as N channels Ch(0), Ch(1), ..., and Ch(N−1), wherein each channel can have a plurality of error free modules. The plurality of NV memory chips (such as the larger number of flash chips described above) managed by the multi-layer interface chipset can respectively correspond to the plurality of channels, and the plurality of sets of NV memory chips can correspond to one of the plurality of channels. For example, the interface chip 300 and the plurality of other interface chips (such as interface chips {300-1, 300-2, ..., 300-M}) can correspond to the channel. For another example, the interface chip 300, the plurality of other interface chips (such as the interface chips {300-1, 300-2, ..., 300-M}), and the plurality of sets of NV memory chips can belong to the channel, rather than any other channel of the plurality of channels.

In addition, the storage device comprises the multi-layer interface chipset. According to some embodiments, the interface chip 300 belongs to a layer of interface chipset of the multi-layer interface chipset, such as a first layer interface chipset, and the plurality of other interface chips (such as interface chips {300-1, 300-2, ..., 300-M} belong to another layer of interface chipset of the multi-layer interface chipset, such as a second layer interface chipset, wherein the first layer interface chipset can operate according to the second configuration, and the second layer interface chipset can operate according to the first configuration. The first layer interface chipset can access the plurality of NV memory chips (such as the larger number of flash chips described above) for the memory controller 110 through the second layer interface chipset. For example, any two of the interface chips in the multi-layer interface chipset can have the same circuit architecture, and the interface chip 300 can be one of the two interface chips, but the present invention is not limited thereto. When the two interface chips are disassembled from the storage device, the two interface chips are exchangeable in the hierarchical architecture for replacement of one another. For example, the multi-layer interface chipset can be the same model of products, such as that having the same circuit design and manufactured under the same process and the same conditions; these products can be regarded as the same product as each other, which omits the possible small differences between these products (due to process and other factors).

According to some embodiments, the interface chips in the first layer interface chipset can be considered as a plurality of first layer interface chips, and the interface chips in the second layer interface chipset can be considered as a plurality of second layer interface chips, wherein the plurality of other interface chips, such as interface chips {300-1, 300-2, . . . , 300-M}, are a set of second layer interface chips in the plurality of second layer interface chips. For example, the second layer interface chips comprises a plurality of sets of second layer interface chips, and the set of second layer interface chips is one set of the plurality of sets of second layer interface chips. The hierarchical architecture comprises a memory controller 110, the plurality of first layer interface chips, the plurality of sets of second layer interface chip, and the plurality of NV memory chips (such as the larger number of flash chips described above).

Figure 8:
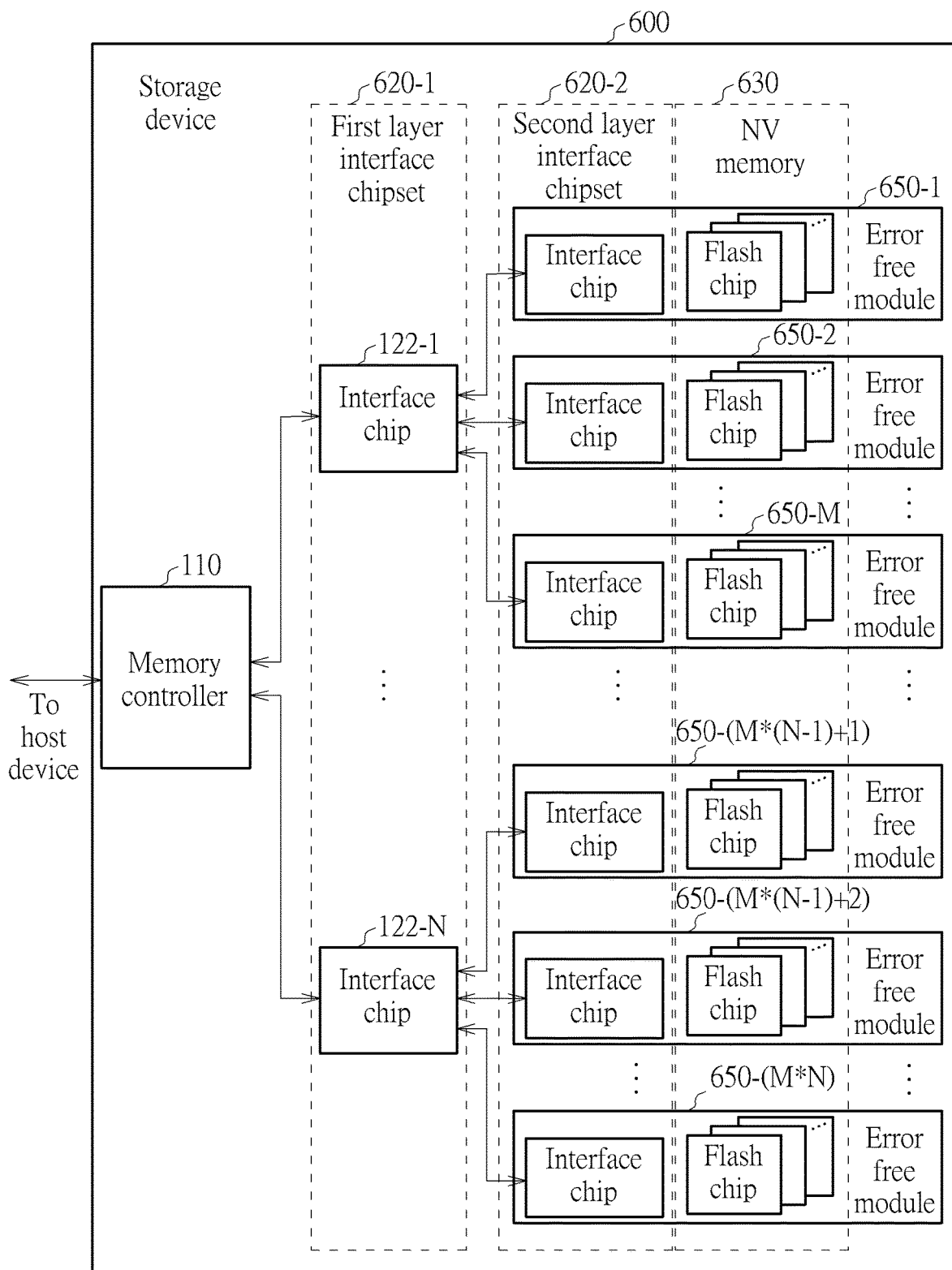
FIG. 8 is a schematic diagram of a storage device according to another embodiment of the present invention, wherein the bypass control scheme shown in FIG. 7 can be applied to the storage device.

FIG. 8 is a schematic diagram of a storage device 600 according to another embodiment of the present invention, wherein the bypass control scheme shown in FIG. 7 can be applied to the storage device 600. The storage device 600 can be an example of the storage device having the larger storage capacity as described in the embodiment shown in FIG. 7. The first layer interface chipset 620-1 and the second layer interface chipset 620-2 can be utilized as an example of the multi-layer interface chipset, and a plurality of sets of NV memory chips (such as the respective flash chips of M error free modules {650-(M*(n−1)+1), 650-(M*(n−1)+2), . . . , 650-(M*n)}) managed by any interface chips 122-n of the interface chips {122-1, 122-2, . . . , 122-N} of the first layer interface chipset 620-1 can be taken as an example of the plurality of sets of NV memory chips accessed by the interface chip 300 through the plurality of other interface chips (such as the interface chips {300-1, 300-2, . . . , 300-M}).

Based on the architecture shown in FIG. 8, the present invention can maximize the storage capacity of the storage device 600 while ensuring the efficiency and reliability of the storage device 600. Compared with the storage device 100, the number of error free modules in the storage device 600 can be increased to (M*N), wherein (M*N) sets of NV memory chips (such as the respective flash chips of the error free modules {{650-1, 650-2, . . . , 650-M}, . . . , {650-(M*(N−1)+1), 650-(M*(N−1)+2), . . . , 650-(M*N)}}) in the NV memory 630 can represent the larger number of flash chips described above. For example, any error free module of the error free modules {{650-1, 650-2, . . . , 650-M}, . . . , {650-(M*(N−1)+1), 650-(M*(N−1)+2), . . . , 650-(M*N)}} can be similar to the error free module 150-n. For another example, any error free module of the error free modules {{650-1, 650-2, . . . , 650-M}, . . . , {650-(M*(N−1)+1), 650-(M*(N−1)+2), . . . , 650-(M*N)}} can be the same as the error free module 150-n. In addition, the coupling relationship between the first layer interface chipset 620-1 and the second layer interface chipset 620-2 can be implemented according to the bypass control scheme. For example, when the interface chip 300 shown in FIG. 7 represents the interface chip 122-1 shown in FIG. 8, the interface chips {300-1, 300-2, . . . , 300-M} shown in FIG. 7 can represent the respective flash chips of the error free modules {650-1, 650-2, . . . , 650-M}; and so on. For another example, when the interface chip 300 shown in FIG. 7 represents the interface chip 122-N shown in FIG. 8, the interface chips {300-1, 300-2, . . . , 300-M} shown in FIG. 7 can represent the respective interface chips of the error free modules {650-(M*(N−1)+1), 650-(M*(N−1)+2), . . . , 650-(M*N)}. Additionally, the first layer interface chipset 620-1 comprises the interface chips {122-1, 122-2, . . . , 122-N}.

The coupling relationships between the interface chips {122-1, 122-2, . . . , 122-N} of the first layer interface chipset 620-1 and the memory controller 110 can be the same as that between the interface chips {122-1, 122-2, . . . , 122-N} of the interface chipset 120 and the memory controller 110, wherein the associated implementation details have been described in some of the above embodiments (such as the embodiments shown in FIGS. 1, 3 and 4). For example, the respective salve interface circuits of the interface chips {122-1, 122-2, . . . , 122-N} of the interface chipset 620-1 can be coupled to the access circuit 116 of the memory controller 110. According to this embodiment, the first layer interface chipset 620-1 can access the (M*N) sets of NV memory chips (such as the respective flash chips of the M error free modules {{650-1, 650-2, . . . , 650-M}, . . . , {650-(M*(N−1)+1), 650-(M* (N−1)+2), . . . , 650-(M*N)}}) in the NV memory 630 for the memory controller 110 through the second layer interface chipset 620-2.

According to some embodiments, under the control of the control circuit (for example, the control circuit 320) of the interface chip 122-n, the interface chip 122-n can combine the plurality of sets of NV memory chips (such as the respective flash chips of the M error free modules {650-(M*(n−1)+1), 650-(M*(n−1)+2), . . . , 650-(M*n)}) managed by the interface chip 122-n into a RAID to store a parity-check code of a set of data into at least one NV memory chip in the plurality of sets of NV memory chips, wherein the set of data is distributed in at least one portion of NV memory chips within the plurality of sets of NV memory chips. In particular, the aforementioned at least one NV memory chip can comprise all of the NV memory chips in a set of NV memory chips within the plurality of sets of NV memory chips, such as the flash chips of the error free module 650-(M*n); and the aforementioned at least one portion of NV memory chips can comprise other sets of NV memory chips in the plurality of sets of NV memory chips, such as the respective flash chips of the first (M−1) error free modules of the M error free modules (such as the other error free modules within the M error free modules {650-(M*(n− 1)+1), 650-(M*(n−1)+2), . . . , 650-(M*n)}, except the error free module 650-(M*n)). In addition, the parity-check code comprises a plurality of partial parity-check codes, and the plurality of partial parity-check codes can be respectively stored in the corresponding pages in the set of NV memory chips (such as the flash chips of the error free module 650-(M*n)). As the interface chips {122-1, 122-2, . . . , 122-N} can perform the RAID protection on the respective flash chips of the M error free modules {{650-1, 650-2, . . . , 650-M}, . . . , {650-(M*(N−1)+1), 650-(M* (N−1)+2), . . . , 650-(M*N)}}, in the hierarchical architecture, this data protection mechanism can be regarded as lower layer RAID protection such as that described above.

According to some embodiments, this RAID belongs to a layer of RAIDs in the storage device 600, such as a lower layer of RAIDs. The interface chips {122-1, 122-2, . . . , 122-N} can respectively combine the respective flash chips of the error free modules {{650-1, 650-2, . . . , 650-M}, . . . , {650-(M*(N−1)+1), 650-(M*(N−1)+2), . . . , 650-(M*N)}} into a number N of RAIDs (N RAIDs), wherein the N RAIDs belong to the layer of RAIDs, and the N RAIDs comprise the RAID. In addition, the memory controller 110 can combine the (M*N) sets of NV memory chips in the NV memory 630 into another layer of RAIDs in the storage device 600, such as a higher layer of RAIDs, wherein the other layer of RAIDs (i.e. the above-mentioned another layer of RAIDs in the storage device 600) is different from the layer of RAIDs.

Figure 9:
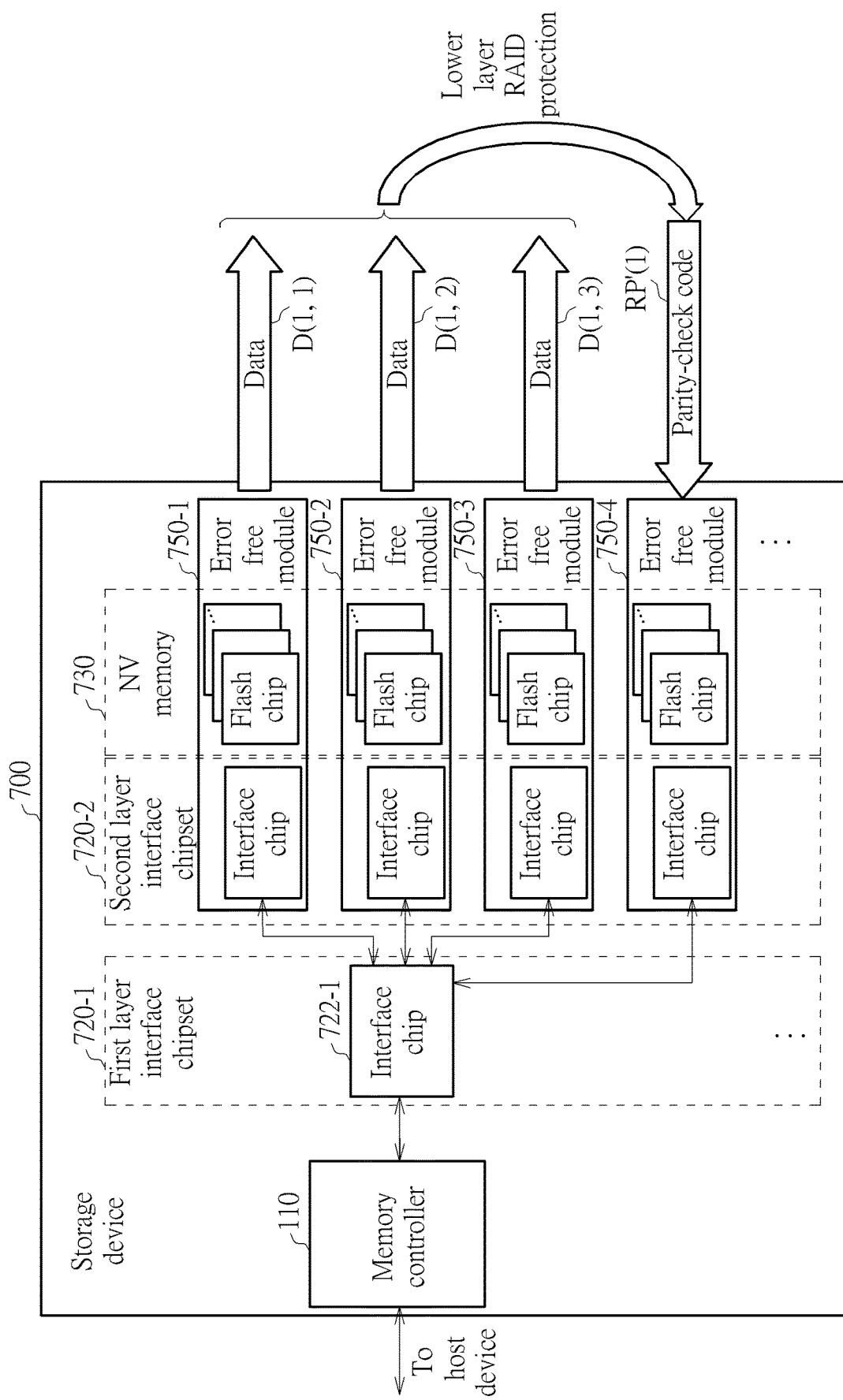
FIG. 9 shows a data protection scheme of the first layer interface chipset shown in FIG. 8 according to an embodiment of the present invention.

FIG. 9 shows a data protection scheme of the first layer interface chipset 620-1 shown in FIG. 8 according to an embodiment of the present invention. For example, M=4, and the storage device 700 can be an example of the storage device 600 shown in FIG. 8, wherein the first layer interface chipset 720-1, the second layer interface chipset 720-2, and the NV memory 730 can be taken as examples of the first layer interface chipset 620-1, the second layer interface chipset 620-2, and the NV memory 630, respectively, and the error free modules {750-1, 750-2, 750-3, 750-4, ...} can be taken as an example of the error free modules {{650-1, 650-2, ..., 650-M}, ..., {650-(M*(N−1)+1), 650-(M*(N−1)+2), ..., 650-(M*N)}}. An interface chip in the first layer interface chipset 720-1 (such as the interface chip 722-1) can respectively utilize chip enable signals (such as chip enable signals CE0, CE1, etc.) to control whether to enable these flash chips via an interface chip in the second layer interface chipset 720-2. For example, the control circuit (such as the control circuit 320) of the interface chip 722-1 can control the interface chip 722-1 to read data D(1, 1), D(1, 2) and D(1, 3) from the respective flash chips of the error free modules 750-1, 750-2, and 750-3, and generate a parity-check code RP'(1) of the data D(1, 1), D(1, 2), D(1, 3) according to the data D(1, 1), D(1, 2), D(1, 3), to write the parity-check code RP'(1) to the flash chips of the error free modules 750-4 to protect the data D(1, 1), D(1, 2), D(1, 3), wherein the parity RP'(1) can be regarded as a RAID parity code. For example, when any data of the data D(1, 1), D(1, 2), D(1, 3) has error (s), the interface chip 722-1 can correct the error(s) according to the parity-check code RP'(1) to ensure the correctness of the data {D(1, 1), D(1, 2), D(1, 3)}.

Figure 10:
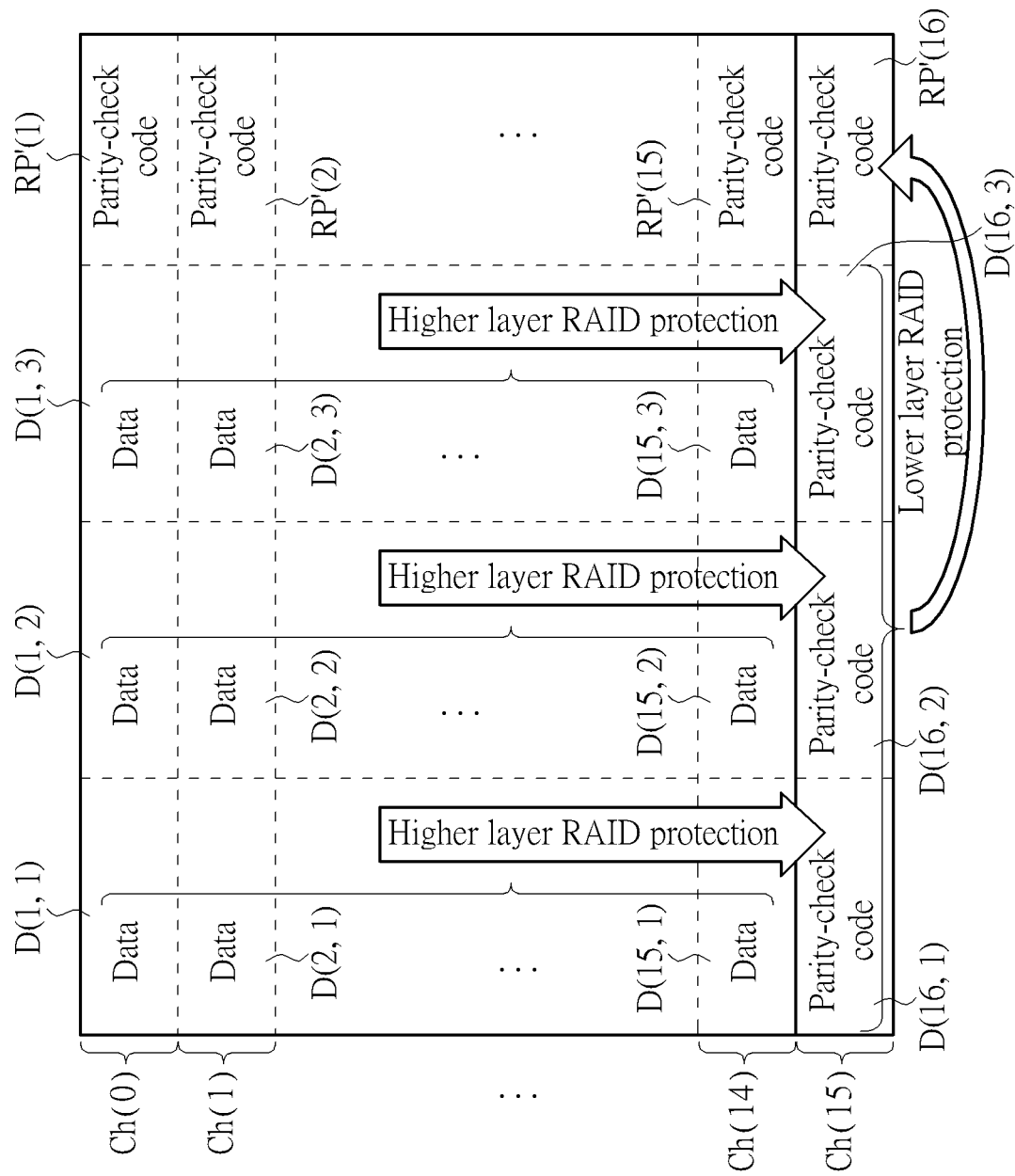
FIG. 10 shows a data protection scheme of the storage device shown in FIG. 8 according to an embodiment of the present invention.

FIG. 10 shows a data protection scheme of the storage device 600 shown in FIG. 8 according to an embodiment of the present invention. For better comprehension, the associated parameters in the embodiment shown in FIG. 9 (for example, M=4) and the corresponding reference numerals will be used. According to this embodiment, there are at least two layers of RAIDs in the storage device 600, such as the layer of RAIDs and the other layer of RAIDs described in the embodiments based on the architecture shown in FIG. 8. Any RAID of the N RAIDs in the layer of RAIDs can perform the lower layer RAID protection shown in FIG. 9. In the case of M=4 and N=16, the N RAIDs such as the RAIDs {RAID'(0), RAID'(1), ..., RAID'(15)} can respectively correspond to the channels {Ch(0), Ch(1), ..., Ch(15)}, and the nth RAID RAID'(n−1) corresponds to the channel Ch(n−1) and generates a parity-check code RP'(n) of the data {D(n, 1), D(n, 2), D(n, 3)} according to the data {D(n, 1), D(n, 2), D(n, 3)}. For example, the first RAID RAID'(0) generates a parity-check code RP'(1) of the data {D(1, 1), D(1, 2), D(1, 3)}, the second RAID RAID'(l) generates a parity-check code parity RP'(2) of the data {D(2,1), D(2,2), D(2,3)}, ..., and the fifteenth RAID RAID'(14) generates a parity-check code RP'(15) of the data {D(15,1), D(15,2), D(15,3)}.

With respect to the other layer of RAIDs, the memory controller 110 can perform the higher layer RAID protection. As shown in FIG. 10, the lower layer RAID protection can correspond to a data arrangement direction, such as the horizontal direction, and the higher layer RAID protection can correspond to another data arrangement direction, such as the vertical direction. The memory controller 110 can generate, according to corresponding page data such as the data of the corresponding pages in the first (N−1) RAIDs {RAID'(0), RAID'(1), ..., RAID'(N−2)} of the N RAIDs, the parity-check code(s) (e.g. one or more parity-check codes) of the data and use the parity-check code(s) as corresponding page data such as the data of the corresponding page(s) (e.g. one or more corresponding pages) in the Nth RAID RAID'(N−1) of the N RAIDs. The Nth RAID RAID'(N−1) is the 16th RAID RAID'(15) in a situation where M=4 and N=16. For example, the memory controller 110 can use the parity-check code of the data {D(1,1), D(2, 1), ..., D(15, 1)} as the data D(16, 1), and use the parity-check code of the data {D(1, 2), D(2, 2), ..., D(15, 2)} as the data D(16, 2), ..., and use the parity-check code of the data {D(1, 3), D(2, 3), ..., D(15, 3)} as the data D(16, 3). Next, the 16th RAID RAID'(15) can perform the lower layer RAID protection to generates a parity-check code RP'(16) based on the data {D(16, 1), D(16, 2), D(16, 3)} (such as the parity-check codes generated by the higher layer RAID protection mechanism).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An interface chip within a storage device, the interface chip comprising:
a control circuit, for controlling operations of the interface chip;
a slave interface circuit, for coupling the control circuit of the interface chip to a memory controller within the storage device to make the interface chip play a role of slave of the memory controller in the storage device; and
at least one bypass interface circuit, for coupling the control circuit of the interface chip to at least one other interface chip of the storage device to make the at least one other interface chip also play a role of slave of the memory controller in the storage device which comprises the memory controller, the interface chip as well as the at least one other interface chip, and a non-volatile (NV) memory comprising a plurality of NV memory chips;
wherein under the control of the control circuit, the interface chip bypasses at least one of data and at least one command between the memory controller and the at least one other interface chip, allowing the memory controller to access the NV memory through the interface chip in response to a host device command from a host device.

2. The interface chip of claim 1, wherein the at least one bypass interface circuit comprises a plurality of bypass interface circuits, the at least one other interface chip comprises a plurality of other interface chips, and the bypass interface circuits are arranged to couple the interface chip to the other interface chips, respectively.

3. The interface chip of claim 2, wherein the other interface chips are coupled to a plurality of sets of NV memory chips in the plurality of NV memory chips, respectively; and under control of the control circuit, the interface chip access the sets of NV memory chips for the memory controller through the other interface chips, respectively.

4. The interface chip of claim 1, wherein the at least one other interface chip is coupled to at least one set of NV memory chips in the plurality of NV memory chips; and a hierarchical architecture in the storage device comprises the memory controller, the interface chip, the at least one other interface chip, and the at least one set of NV memory chips.

5. The interface chip of claim 4, wherein the interface chip is a multi-functional interface chip, and has a plurality of functions respectively corresponding to a plurality of configurations; any of the at least one other interface chip has a same circuit architecture as the interface chip with said same circuit architecture supporting the plurality of configurations; and the at least one other interface chip operates according to a first configuration which is one of the plurality of configurations, and the interface chip operates according to a second configuration which is another of the plurality of configurations.

6. The interface chip of claim 5, wherein the at least one bypass interface circuit comprises a plurality of bypass interface circuits, the at least one other interface chip comprises a plurality of other interface chips, and the bypass interface circuits are arranged to couple the interface chip to the other interface chips, respectively; the at least one set of NV memory chips comprises a plurality of sets of NV memory chips; and the interface chip further comprises:
 a master interface circuit, the master interface circuit having a NV memory chip coupling function, wherein:
  according to the second configuration, the master interface circuit of the interface chip is idle; and
  according to the first configuration, a corresponding master interface circuit of any other interface chip of the plurality of other interface chips is configured for coupling a corresponding control circuit of the any other interface chip to a set of NV memory chips within the plurality of sets of NV memory chips to make the any other interface chip play a role of master of the set of NV memory chips in the storage device, to allow the any other interface chip to access the set of NV memory chips within the plurality of sets of NV memory chips for the memory controller.

7. The interface chip of claim 6, wherein according to the first configuration, a plurality of corresponding bypass interface circuits of the any other interface chip are idle.

8. The interface chip of claim 1, wherein the at least one other interface chip is coupled to at least one set of NV memory chips in the plurality of NV memory chips; and the plurality of NV memory chips respectively correspond to a plurality of channels of the storage device, and the at least one set of NV memory chips correspond to a channel of the plurality of channels.

9. The interface chip of claim 8, wherein the interface chip and the at least one other interface chip correspond to the channel.

10. The interface chip of claim 8, wherein the interface chip, the at least one other interface chip, and the at least one set of NV memory chips belong to the channel, rather than any other channel of the plurality of channels.

11. The interface chip of claim 1, wherein the storage device comprises a multi-layer interface chipset, the interface chip belongs to a layer of interface chipset of the multi-layer interface chipset, and the at least one other interface chip belongs to another layer of interface chipset of the multi-layer interface chip set.

12. The interface chip of claim 11, wherein the layer of interface chipset accesses the plurality of NV memory chips for the memory controller through the another layer of interface chipset.

13. The interface chip of claim 12, wherein a hierarchical architecture in the storage device comprises the memory controller, multi-layer interface chipset, and the plurality of NV memory chips; and any two interface chips in the multi-layer interface chipset have a same circuit architecture; and when the two interface chips are disassembled from the storage device, the two interface chips are exchangeable in the hierarchical architecture for replacement of one another.

14. The interface chip of claim 1, wherein the at least one other interface chip is coupled to at least one set of NV memory chips in the plurality of NV memory chips; and under the control of the control circuit, the at least one set of NV memory chips are combined into a Redundant Array of Independent Disks (RAID) to store a parity-check code of a set of data into at least one NV memory chip in the at least one set of NV memory chips, wherein the set of data is distributed in at least one portion of NV memory chips within the at least one set of NV memory chips.

15. The interface chip of claim 14, wherein the at least one bypass interface circuit comprises a plurality of bypass interface circuits, the at least one other interface chip comprises a plurality of other interface chips, and the bypass interface circuits are arranged to couple the interface chip to the other interface chips, respectively; the at least one set of NV memory chips comprises a plurality of sets of NV memory chips; the at least one NV memory chip comprise all NV memory chips in a set of NV memory chips within the plurality of sets of NV memory chips, and the at least one portion of NV memory chips comprise other sets of NV memory chips in the plurality of sets of NV memory chips; and the parity-check code comprises a plurality of partial parity-check codes, and the partial parity-check codes are respectively stored in corresponding pages in the set of NV memory chips within the plurality of sets of NV memory chips.

16. The interface chip of claim 14, wherein the RAID belongs to a layer of RAIDs; and the memory controller combines the plurality of NV memory chips into another layer of RAIDs, wherein the another layer of RAIDs is different from the layer of RAIDs.

17. The interface chip of claim 16, wherein the storage device comprises a multi-layer interface chipset, the interface chip belongs to a layer of interface chipset of the multi-layer interface chipset, and the at least one other interface chip belongs to another layer of interface chipset of the multi-layer interface chip set; and the layer of interface chip set operates according to a configuration in a plurality of configurations, and the another layer of interface chipset operates according to another configuration in the plurality of configurations.

18. A storage device, comprising:
 a non-volatile (NV) memory for storing information, wherein the NV memory comprises a plurality of NV memory chips;
 a memory controller, for controlling operations of the storage device; and
 a plurality of interface chips, coupled between the memory controller and the NV memory, wherein the plurality of interface chips comprises a plurality of first layer interface chips and a plurality of second layer interface chips, and any interface chip of the plurality of first layer interface chips comprises:
  a control circuit, for controlling operations of the interface chip;
  a slave interface circuit, for coupling the control circuit of the interface chip to the memory controller to make the interface chip play a role of slave of the memory controller in the storage device; and
  at least one bypass interface circuit, for coupling the control circuit of the interface chip to at least one other interface chip to make the at least one other interface chip also play a role of slave of the memory controller in the storage device, wherein the at least one other interface chip belongs to the plurality of second layer interface chips;

wherein under the control of the control circuit, the interface chip bypasses at least one of data and at least one command between the memory controller and the at least one other interface chip, allowing the memory controller to access the NV memory through the interface chip in response to a host device command from a host device.

19. The storage device of claim 18, wherein the at least one bypass interface circuit comprises a plurality of bypass interface circuits, the at least one other interface chip comprises a plurality of other interface chips, and the bypass interface circuits are arranged to couple the interface chip to the other interface chips, respectively, wherein the other interface chips are a set of second layer interface chips of the plurality of second layer interface chips.

20. The storage device of claim 19, wherein the other interface chips are coupled to a plurality of sets of NV memory chips in the plurality of NV memory chips, respectively; and under control of the control circuit, the interface chip access the sets of NV memory chips for the memory controller through the other interface chips, respectively.

21. The storage device of claim 18, wherein the at least one other interface chip is coupled to at least one set of NV memory chips in the plurality of NV memory chips; and a hierarchical architecture in the storage device comprises the memory controller, the interface chip, the at least one other interface chip, and the at least one set of NV memory chips.

22. The storage device of claim 21, wherein the interface chip is a multi-functional interface chip, and has a plurality of functions respectively corresponding to a plurality of configurations; any of the at least one other interface chip has a same circuit architecture as the interface chip with said same circuit architecture supporting the plurality of configurations; and the at least one other interface chip operates according to a first configuration which is one of the plurality of configurations, and the interface chip operates according to a second configuration which is another of the plurality of configurations.

23. The storage device of claim 21, wherein the plurality of second layer interface chips comprises a plurality of sets of second layer interface chips, and the at least one other interface chip belongs to a set of the plurality of sets of second layer interface chips; and the hierarchical architecture comprises the memory controller, the plurality of first layer interface chips, the plurality of sets of second layer interface chips, and the plurality of NV memory chips.

24. The storage device of claim 18, wherein the at least one other interface chip is coupled to at least one set of NV memory chips in the plurality of NV memory chips; and the plurality of NV memory chips respectively correspond to a plurality of channels of the storage device, and the at least one set of NV memory chips correspond to a channel of the plurality of channels.

* * * * *